Aug. 22, 1961 T. HAMBURGER ET AL 2,997,606
HIGH SPEED SWITCHING CIRCUIT
Filed Nov. 27, 1959
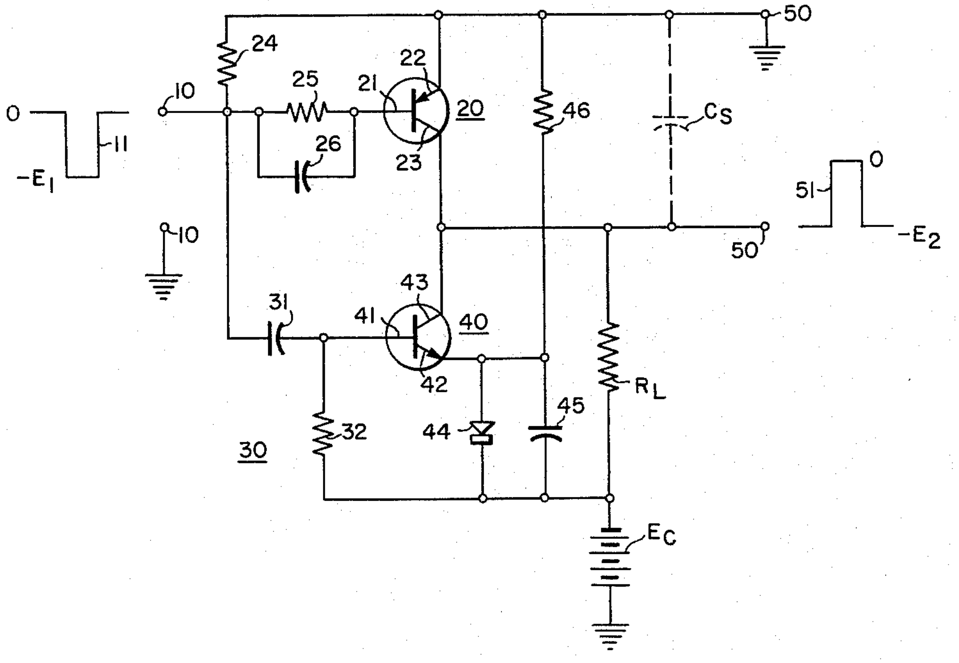
WITNESSES
Edwin E. Bassler
James F. Young
INVENTORS
Charles H. Wood, Jr. &
Theodore Hamburger
BY V. W. Cleary
ATTORNEY United States Patent Office 2,997,606

Patented Aug. 22, 1961

2,997,606

HIGH SPEED SWITCHING CIRCUIT

Theodore Hamburger, Baltimore, and Charles H. Wood, Jr., Arbutus, Md., assignors to Westinghouse Electric Corporation, East Pittsburgh, Pa., a corporation of Pennsylvania Filed Nov. 27, 1959, Ser. No. 855,658
3 Claims. (Cl. 307—88.5)

The present invention relates to a high speed switching circuit and more particularly to a transistor switching circuit having a relatively low switching time.

In switching circuits, many factors determine or effect the minimum switching time. One important factor which increases the switching time, is the shunt capacity across the load resistor as well as stray capacities within the circuit. Another of the most important factors is the storage time of the transistor in transistor switching circuits. Both of these factors affect the trailing edge of the pulse produced by turning the transistor off. There are means currently in use for reducing effects of shunt capacity, but these means generally result in wasted power and reduction in efficiency of the circuit. Additionally, the minority carrier storage time effect may be reduced by limiting the degree of saturation of the switching transistor. However, this also results in a waste of power. In addition, it increases the turn-on time of the switching transistor.

Accordingly it is an object of the invention to provide a switching circuit wherein the rise time of the trailing edge of the output pulse thereof is minimized.

It is another object of the invention to provide a switching circuit wherein the effect of the stray and shunt capacitance of the circuit on the trailing edge of an output pulse thereof is minimized.

Still another object of the invention is the provision of a transistorized high speed switching circuit wherein the capacitance of the transistor and of the circuit on the switching time is minimized with a minimum loss of power.

Still a further object of the invention is to provide a high speed transistorized switching circuit wherein the effect of the storage time of the transistor, the load capacitance and any other stray capacitance on the trailing edge of the pulse being passed therethrough, is minimized with a minimum of wasted power and reduction in efficiency of the circuit.

Other features of the invention reside in the specific circuit arrangement and connections as hereinafter more fully described with reference to the drawing, in which:

The single figure of the drawing is a schematic circuit diagram of a switching circuit embodying the invention.

The embodiment of the invention illustrated in the drawing consists generally of a first transistor gate means including a transistor 20 which is normally non-conductive and adapted to receive an input pulse 11 to render the gate or transistor conductive. Across the output of the transistor 20 is connected a second normally non-conductive transistor gate means 40. The input pulse 11 is also applied to the second transistor gate means 40 through a differentiating means 30. The transistor 20 is a PNP type transistor and hence is rendered conductive by the negative going pulse 11. The transistor 40, however, is of the NPN type and hence when pulse 11 is applied to the differentiating means 30 and then to the base of the transistor 40, it will only tend to drive the transistor away from conduction. When the trailing edge of the input pulse 11 reaches the base of the first transistor 20, it will render it nonconductive. However, during the conduction period of transistor 20 there was energy stored in the transistor as well as in the shunt capacitance of the load and other stray capacitance of the circuit. These capacitances will ordinarily tend to increase the rise time of the trailing edge of the output pulse 51 so as to increase the switching time of the circuit. In the embodiment of the present invention, illustrated in the drawing, the trailing edge of the input pulse, which is positive going, is applied to a differentiating circuit 30 the output of which is applied to the base of the second transistor 40. Since the output of this differentiating means 30 will be positive going it will render the transistor 40 conductive, momentarily. The second transistor 40 has its emitter and collector connected across the load resistor of the first transistor so that when the transistor 40 is rendered conductive it will prevent any storage time effects from appearing at the output of the switching transistor 20. It will also provide a low impedance discharge path for the capacitance of the load or any other stray circuit capacitance. Since the second transistor is rendered conductive by the positive going trailing edge of the input signal the low impedance path will be inserted in the output circuit of the first transistor 20, coincidence in time with the trailing edge of the output signal or pulse. This enables discharge of the capacitances of the first transistor 20 and of the load and of stray capacitance immediately upon appearance of the trailing edge of the output of the transistor 20 so as to effectively and efficiently reduce the rise time of the trailing edge of the output pulse.

More specifically the embodiment of the invention illustrated in the drawing comprises a first transistor gate means 20 which includes a transistor 20 having a base electrode 21, an emitter electrode 22 and a collector electrode 23. Input terminals 10 are provided to apply a negative going pulse 11 to the base of the transistor 20. A resistor 24 is connected between the emitter 22 and one of said input terminals 10. A resistor 25 and a capacitor 26 are connected in parallel in-between the base 21 and the one of the input terminals 10. This is to decrease the turn-on time of switching transistor 20. The emitter 22 of transistor 20 is grounded. The emitter 22 and the collector 23 are connected to two output terminals 50 as shown in the drawing one of which is grounded. The stray capacitance of a circuit is illustrated symbolically in the drawing as $C_s$.

When the negative going pulse 11 is applied to the base of the PNP transistor 20 it will render the transistor 20 conductive for the time substantially equivalent to the width of the pulse 11. This pulse will also be applied to a differentiating means 30 including a differentiating capacitor 31 and a resistor 32. The output of the differentiating means 30 is applied to a second transistorized gate means 40 which is normally nonconductive. The second transistorized gate means includes a second transistor 40 having a base electrode 41, an emitter electrode 42 and a collector electrode 43. Since the second transistor 40 is a NPN type the leading edge of pulse 11 will not tend to render the transistor 40 conductive since this leading edge is negative going.

The second transistorized gate means includes a relatively large resistor 46 which is connected between the emitter 42 and ground. A diode 44 as well as a bypass condenser 45 are connected between the emitter 42 and the negative side of the D.C. collector voltage supply $E_c$. The first anode 23 and the second anode 43 are connected together. A load resistor $R_L$ is connected between the common point of the collectors 23 and 43 to the negative side of the collector D.C. supply $E_c$.

While the pulse 11 is being applied to the transistor 20 the transistor, the load, and other stray capacitances are being charged. It can be seen that if the transistor 40 was rendered conductive a discharge path for these storage means will be provided from the output terminal 50, ungrounded, to the collector 43, and the emitter 42 of transistor 40, and thence through diode 44 to ground by way of the collector voltage supply $E_c$. When the trailing edge of the substantially rectangular pulse 11 reaches the base of the transistor 20, it will render the transistor 20 nonconductive. The trailing edge of the rectangular pulse 11 will also be applied to the differentiating means 30 to produce a relatively sharp positive going pulse at the base 41 of transistor 40. Hence at this moment the transistor 20 will be cut-off or rendered nonconductive and at the same time or moment the transistor 40 will be rendered conductive so as to provide a shunt low impedance unidirectional current path for discharging the energy stored in the transistor 20 and the load, and the stray capacitance.

The resistor 46 is of sufficient value so as to maintain the transistor 40 normally nonconductive. Additionally, when the transistor 40 is rendered conductive the diode 44 will appear in the circuit as a relatively low impedance due to being forward biased through the resistor 46.

While we have described above the principles of our invention in connection with the specific apparatus, it is clearly understood that this description is made only by way of example, not as a limitation of the scope of our invention.

We claim as our invention:

1. A high speed switching circuit comprising a first gate means including a first semiconductor device having at least a base, an emitter and a collector electrode, input terminals for applying a signal between the emitter and base of said first semiconductive device, said first semiconductive device being rendered conductive in response to a substantially rectangular pulse being applied to said input terminals and the second gate means being connected between said first emitter and collector electrodes including a second semiconductive device of opposite polarity, and differentiating means connected to said input terminals and responsive to the trailing edge of the rectangular pulse for rendering said second semiconductive device conductive and placing said second emitter and said second collector across said first emitter and said first collector.

2. A high speed switching circuit comprising a first normally nonconductive semiconductor device having at least a base, an emitter and a collector electrode, input terminals for applying a substantially rectangular pulse to the emitter and base of said first semiconductive device and rendering said first semiconductive device conductive, a second semiconductor device having a second base, a second emitter and a second collector electrode, said second semiconductor device being of an opposite conductivity type from said first semiconductor device, said first collector being connected to said second collector, said second emitter being connected to said first emitter through a unidirectional current device, differentiating means connected to said input terminals and said second base and said second emitter-collector electrodes, said differentiating means responsive to the trailing edge of the substantially rectangular pulse for rendering said semiconductive device conductive to thereby provide a unidirectional low impedance path across said first emitter and said first collector electrode.

3. A high speed switching circuit comprising a first semiconductive device having at least a first base, a first emitter and a first collector electrode, means for rendering said first semiconductor device normally nonconductive, input terminal means for applying a signal between said first emitter and said first base electrode, said first semiconductor device responsive to a substatnially rectangular pulse to be rendered conductive, a second semiconductor device of an opposite polarity type having at least a second base, a second emitter and a second collector electrode, means for rendering said second semiconductor device normally nonconductive, said second collector electrode being connected to said first collector electrode, said second emitter being connected to said first emitter through a unidirectional current device, output terminal means connected to said first emitter and said first collector electrodes, differentiating means connected between said input terminals and said second base and said second emitter electrodes, said differentiating means responsive to the trailing edge of the substantially rectangular pulse for rendering said second semiconductor device conductive to provide a low impedance discharge path across said first emitter and said first collector electrodes.

References Cited in the file of this patent

UNITED STATES PATENTS

| | | |
|---|---|---|
| 2,647,240 | Todd | July 28, 1953 |
| 2,871,378 | Lohman | Jan. 27, 1959 |